United States Patent
Corbo et al.

(10) Patent No.: US 10,524,381 B1
(45) Date of Patent: Dec. 31, 2019

(54) SPRING MOUNTED SLIDABLE LOCK FOR RACK COMPONENTS

(71) Applicant: Legrand AV Inc., Fairfield, NJ (US)

(72) Inventors: Nico Corbo, Blairstown, NJ (US); Leszek Markowski, Riverdale, NJ (US)

(73) Assignee: Legrand AV Inc., Fairfield, NJ (US)

( * ) Notice: Subject to any disclaimer, the term of this patent is extended or adjusted under 35 U.S.C. 154(b) by 0 days.

(21) Appl. No.: 16/545,732

(22) Filed: Aug. 20, 2019

(51) Int. Cl.
*H05K 7/14* (2006.01)
*H05K 7/18* (2006.01)
*A47B 88/43* (2017.01)

(52) U.S. Cl.
CPC .............. *H05K 7/183* (2013.01); *A47B 88/43* (2017.01); *H05K 7/14* (2013.01)

(58) Field of Classification Search
CPC ........... H05K 7/183; H05K 7/14; A47B 88/43
See application file for complete search history.

(56) References Cited

U.S. PATENT DOCUMENTS

| | | | | |
|---|---|---|---|---|
| 6,373,707 B1* | 4/2002 | Hutchins | ................. | G06F 1/183 211/41.17 |
| 6,601,932 B1* | 8/2003 | Helgenberg | ........... | H02B 1/301 211/26 |
| 6,929,339 B1* | 8/2005 | Greenwald | .......... | H05K 7/1421 211/26 |
| 7,318,532 B1* | 1/2008 | Lee | ....... | H05K 7/1405 211/26 |
| 7,364,244 B2* | 4/2008 | Sandoval | ............. | H05K 7/1411 312/333 |
| 7,992,950 B2* | 8/2011 | Lauchner | ............... | A47B 88/43 312/334.5 |
| 8,727,138 B2* | 5/2014 | Dittus | ..................... | H05K 7/183 211/26 |
| 9,131,622 B2 | 9/2015 | Schluter et al. | | |
| 2006/0283816 A1* | 12/2006 | Moore | ................... | A47B 45/00 211/26 |
| 2008/0203251 A1* | 8/2008 | Chen | ....................... | G06F 1/183 248/200 |
| 2012/0091075 A1* | 4/2012 | Chapel | ................. | H05K 7/1489 211/26 |
| 2013/0112638 A1* | 5/2013 | Dittus | .................. | H05K 7/1489 211/123 |

* cited by examiner

*Primary Examiner* — Kimberley S Wright
(74) *Attorney, Agent, or Firm* — Drinker Biddle & Reath LLP

(57) ABSTRACT

An electronics rack component including at least one slide locking mechanism for removably securing the component to a rack. The slide lock mechanism includes a slide lock with a support configured to slide along a flat flange portion of the rail. A release lever protrudes from the top surface of the support base and provides a structure or surface for a user's finger to slide the support base along the flat flange portion. A locking latch extends downward from the bottom surface of the base and through the slot in the rail. The locking latch includes a portion spaced apart from the bottom surface of the base a distance to accommodate the flat flange portion and a flange on the electronics rack. A spring biases the slide lock toward the end of the component.

9 Claims, 5 Drawing Sheets

SPRING MOUNTED SLIDABLE LOCK FOR RACK COMPONENTS

FIELD OF THE INVENTION

The invention relates to a device for attaching components to an electronics rack and, in particular, to slidable locking system for removably securing rack rails and other components to a rack assembly.

BACKGROUND

An electronics rack or rack assembly is commonly used for securely storing and supporting electronic components, such as computer, audio, and video equipment. Typically, a rack assembly is an open framework including vertical mounting rails connected by top and bottom frames. To enable the rack assembly to accommodate various size components at desired locations, rack rails may extend across the rack assembly from one vertical mounting post to another. In conventional commercially available systems, the rack rails are generally bolted or otherwise fastened to the mounting rails, which requires the use of tools. Alternatively, the rack rails may include a static hook shape at each end so that the rack rails are held in slots in the mounting rails by the force of gravity acting on the rack rails themselves as well as on components supported by the rack rails. But the use of mechanical fasteners such as bolts can be cumbersome and time consuming, and relying on gravity alone risks that a rack rail can be dislodged inadvertently.

Middle Atlantic Products, Inc. developed a unique locking system called the Lever Lock® fastening system that uses a spring mounted pivotable latch for removably securing a rack support, such as a bracket or crossbar, to an electronics rack or shelving unit. The Lever Lock® fastening system is described in U.S. Pat. No. 9,131,622. The Lever Lock® fastening system has proven extremely successful. However, a pivotable latch might not work in tight locations.

Therefore, it would be desirable to have an improved rack rail locking mechanism to easily and removably secure a rack rail or other component to a rack assembly mounting rail.

SUMMARY OF THE INVENTION

An electronics rack component for use on an electronics rack is disclosed which includes at least one slide locking mechanism for removably securing the component to the rack. The component includes a flat flange portion located at one end of the component, the flat flange portion including a slot formed through the flat flange portion proximate to the end. The slide locking mechanism attached to the flat flange portion over the slot so that a portion of the slide mechanism extends through the slot.

The slide lock mechanism includes a slide lock with a support base that has a top surface and a flat bottom surface. The bottom surface is configured to slide along the flat flange portion of the rail. The base has a width that is wider than a width of the slot so that the base is supported by the flat flange portion.

A release lever protrudes from the top surface of the support base and provides a structure or surface for a user's finger to slide the support base along the flat flange portion.

A locking latch extends downward from the bottom surface of the base and through the slot in the rail. The locking latch includes a neck portion attached to the bottom surface of the base and a protruding tab attached to an opposite end of the neck portion. The tab includes a forward face with a portion that slopes away from the bottom of the base and toward a back of the slide lock. The tab includes a top surface extending forward from the neck and is generally horizontal or slopes away from the bottom surface of the base. The top surface of the tab is spaced apart from the bottom surface of the base a distance to accommodate the flat flange portion and a flange on the electronics rack.

A body extends downward from the bottom surface of the base and is spaced rearward and apart from the locking latch. The body extends through the slot in the component.

A spring is mounted to or formed on the body and engages with the component so as to bias the slide lock toward the end of the component.

In an embodiment, the spring is a coil spring with a first leg that extends into and contacts a rear surface of the slot and a second leg on an opposite side of the coil contacts a surface of the body.

In another embodiment, the spring is a lever formed on a portion of the housing which contacts the back of the slot.

Optionally the body includes a recess within which the spring is located.

The component may be a cross-rail, cross-bar, bracket, cable management cage, tray table, or shelf.

The slope of the top surface may be in a range of between about 0 degrees to about 40 degrees. Optionally, the slope of the top surface is in a range of between about 10 to about 25 degrees.

The foregoing and other features of the invention and advantages of the present invention will become more apparent in light of the following detailed description of the preferred embodiments, as illustrated in the accompanying figures. As will be realized, the invention is capable of modifications in various respects, all without departing from the invention. Accordingly, the drawings and the description are to be regarded as illustrative in nature, and not as restrictive

BRIEF DESCRIPTION OF DRAWINGS

For the purpose of illustrating the invention, there are shown in the drawings embodiments that are presently preferred; it being understood, however, that this invention is not limited to the precise arrangements and constructions particularly shown.

DETAILED DESCRIPTION

Figure 1:
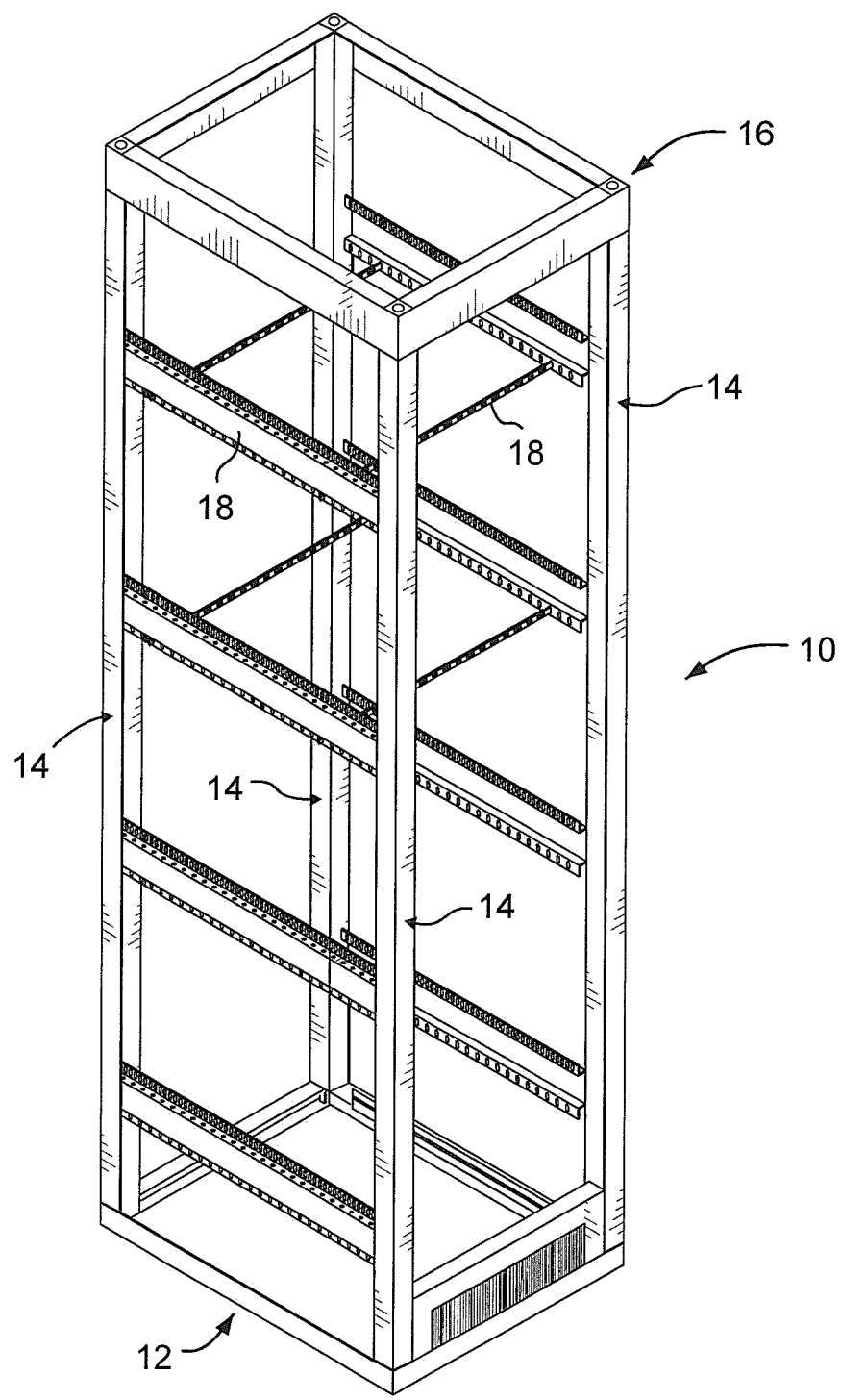
FIG. 1 is a perspective view of an electronics rack with a removable locking assembly according to the present invention for attaching components to the rails and posts.

Referring to the drawings, a preferred form of a spring mounted locking mechanism for a rack component is illustrated. FIG. 1 illustrates a generally conventional rack assembly 10. The rack assembly includes a bottom or base frame 12, which is generally square or rectangular in shape, and onto which a plurality of vertical posts or rails 14 are attached. The upper ends of the vertical posts attach to a top frame 16, also generally square or rectangular in shape. The rack assembly 10 includes one or more components 18 that are removably mounted to the vertical rails for configuring the rack assembly for a particular use. The components may include cross-rails, cross-bars, brackets, cable management cages, tray tables, and shelves. The components attach to and extend between adjacent vertical posts 14 of the rack assembly 10. For simplicity, a rail will be discussed below. However, a person skilled in the art would readily appreciate the applicability of the following description to cross-rails, cross-bars, brackets, cable management cages, tray tables, and shelves.

Figure 2:
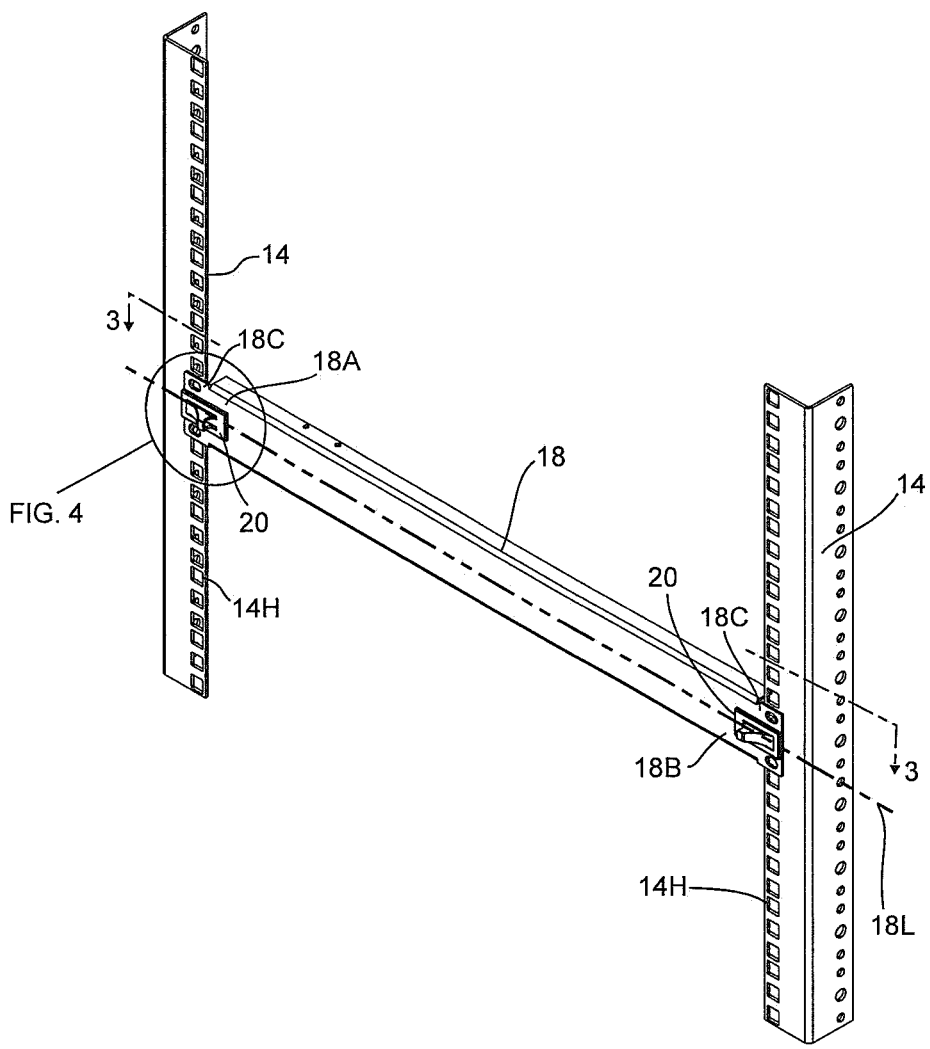
FIG. 2 is an enlarged view illustrating one embodiment of a slide locking assembly according to the present invention used for securing a horizontal rail to two vertical posts.
Figure 3:
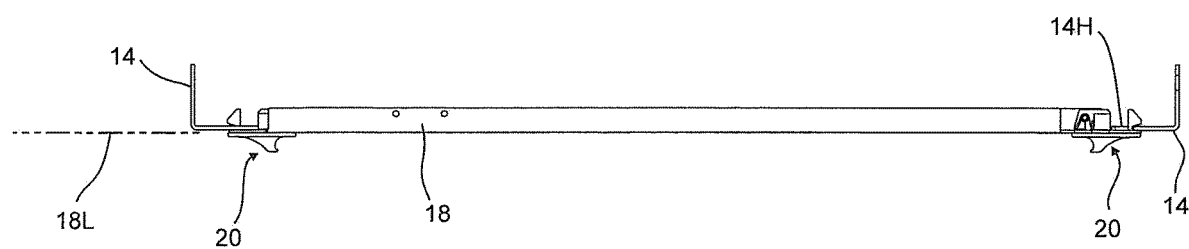
FIG. 3 is a section view of the horizontal rail and vertical posts of FIG. 2 taken along lines 3-3 in FIG. 2.

Referring to FIG. 2, an enlarged view of a rack rail 18 attached to two vertical posts 14 is shown. The ends of the rail 18 include a slidable locking assembly 20 according to the present invention. As will be explained below, the slidable locking assembly 20 removably engages with the vertical post 14. In the illustrated embodiment, the rail 18 includes ends 18A and 18B, at least one of which includes the locking assembly 20. At least one end of the rail 18 preferably includes a planar or flat flange portion 18C proximate to the end 18A that lies along a plane 18P that is parallel to a longitudinal axis 18L of the rail 18 (i.e., the plane along which the locking assembly 20 slides).

Figure 4:
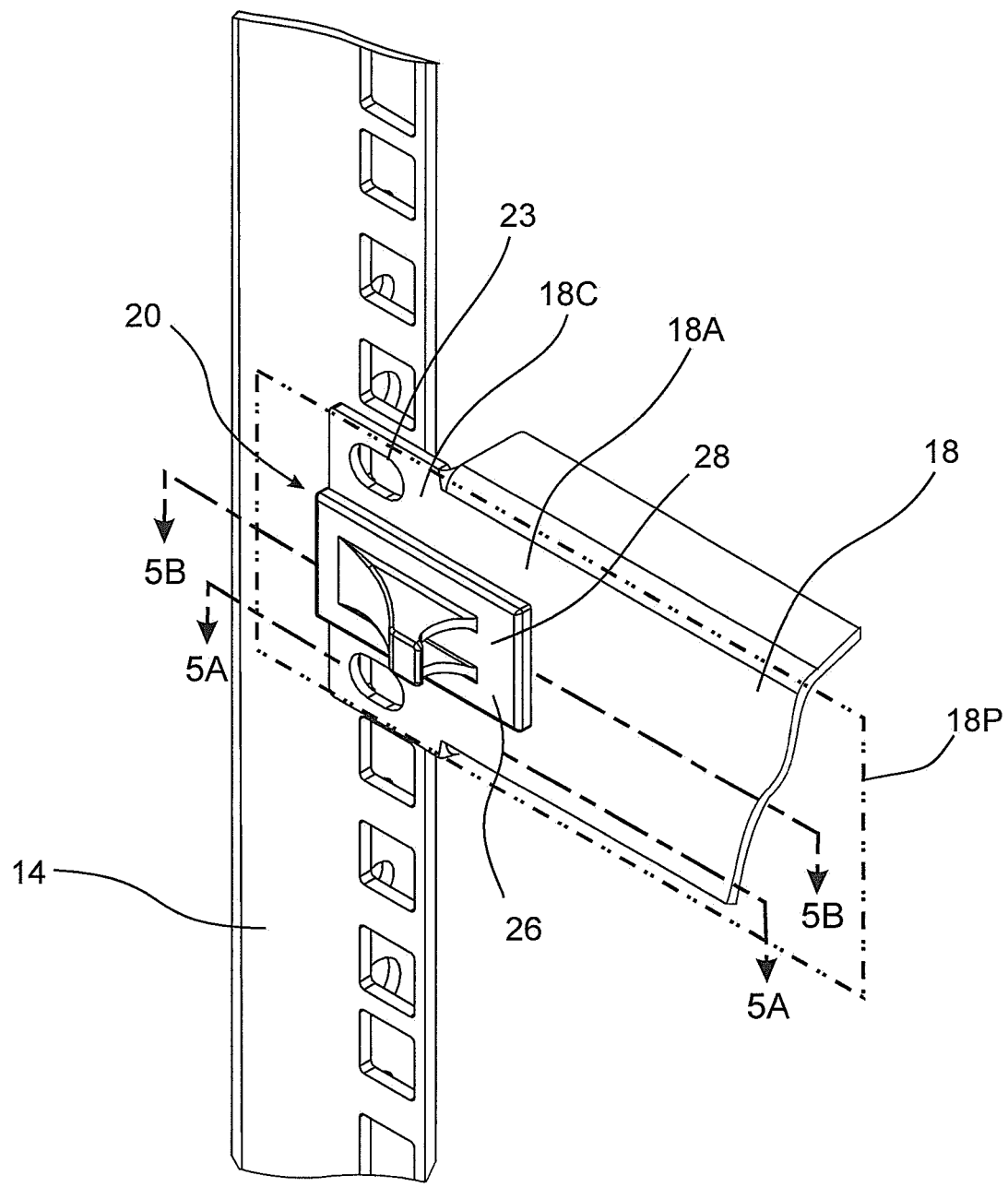
FIG. 4 is an enlarged view of one slide locking assembly according to the present invention mounted on an end of the horizontal rail in FIG. 2.

In one optional configuration, at least one projection or tab 22 (shown in FIG. 5A) preferably extends from the flat flange portion 18C of the rail in a direction away from the longitudinal plane 18P. The protrusion 22 is preferably sized to fit into a recess or hole 14H in the vertical post 14 so as to assist in locking the rail to the post as will be explained in more detail below. In the illustrated embodiment, each end 18A, 18B of the rail preferably has two projections 22, one located on either side of the locking assembly 20. The projection 22 can be formed by punching a portion of the rail end 18A out of its normal plane to form the projection 22 (see 5A.) Alternatively, instead of protrusions, the rail ends 18A, 18B can include holes 23 (FIG. 4) that are located so as to align with the holes 14H in the vertical post 14. The holes 23 in the rail permit fasteners, such as screws or bolts to be inserted to provide additional securement of the rail to the post.

Figure 5A:
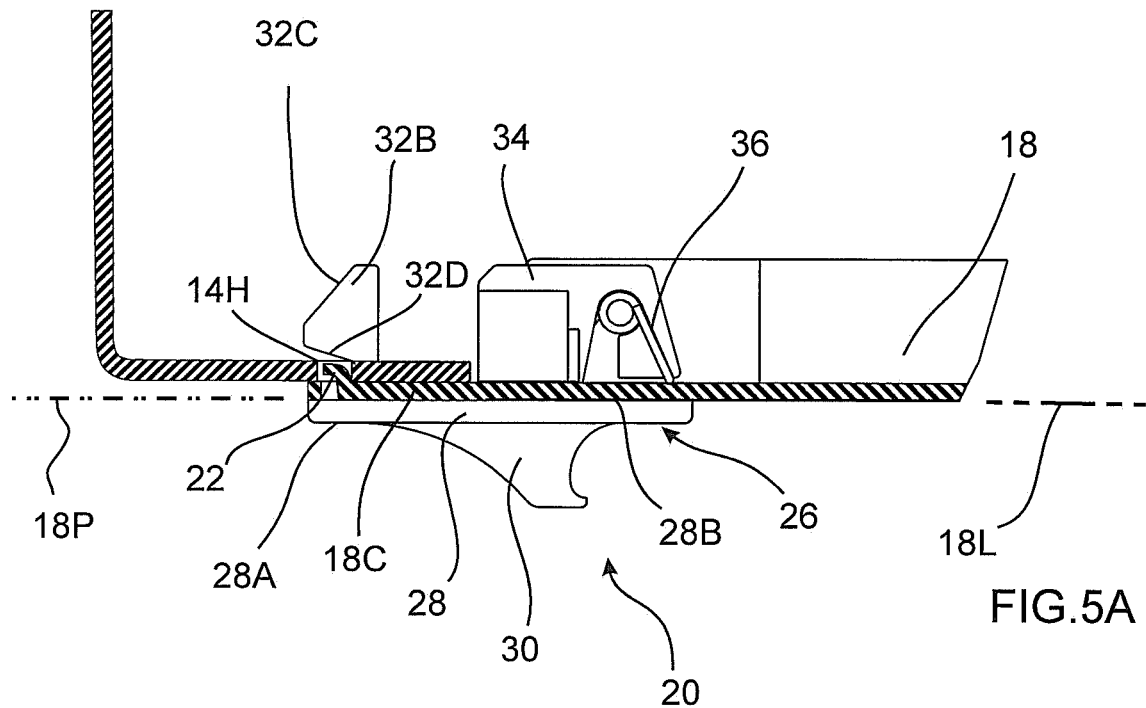
FIG. 5A is a cross-sectional view of the slide locking assembly, rail and post of FIG. 4 taken along lines 5A-5A in FIG. 4.
Figure 5B:
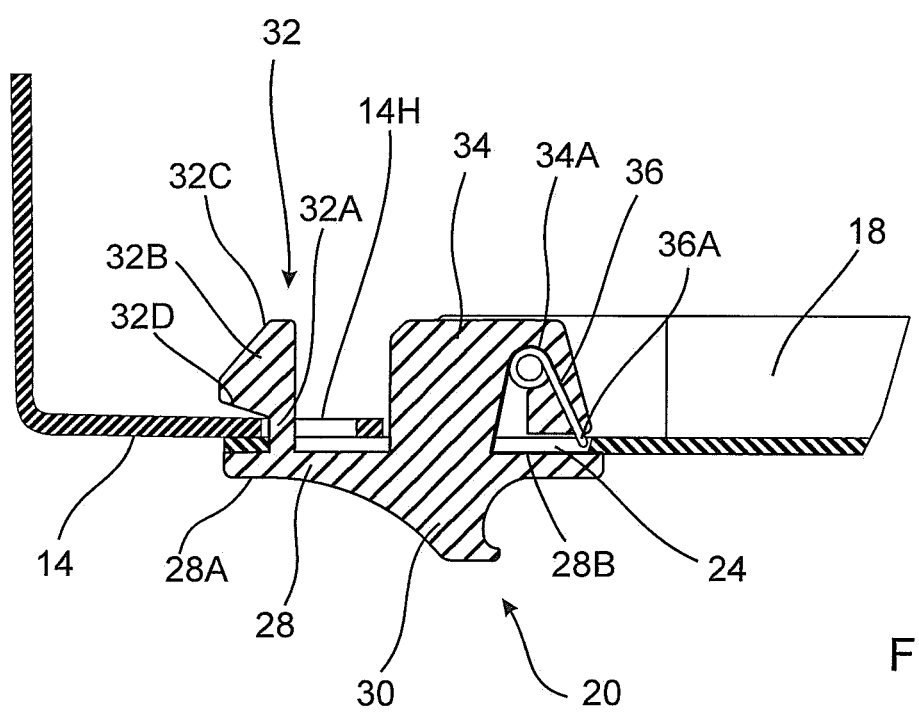
FIG. 5B is another cross-sectional view of the slide locking assembly, rail and post of FIG. 4 taken along lines 5B-5B in FIG. 4.

The slidable locking assembly 20 is shown in more detail in FIGS. 5A and 5B, which are cross-sectional views of the rail 18. The rail 18 preferably includes a slot or hole 24 formed through the flat flange portion 18C of the rail. The slot 24 is located proximate to an end 18A, 18B of the rail, but preferably does not extend all the way to the end. The locking assembly 20 includes a slide lock 26 that has a support base 28 with a top surface 28A and a flat bottom surface 28B. The flat bottom surface 28B is configured to slide along the flat flange portion 18C of the rail. The base 28 preferably has a width (in the lateral direction, perpendicular to the sliding direction) that is wider than the width of the slot 24. As such, the slide lock 26 is supported by the flat flange portion 18C of the rail as it slides along the top surface of the flat flange portion 18C.

The slide lock 26 includes a release lever 30 that protrudes or extends from the top surface 28A of the support base 28 and provides a structure or surface that a user can press on with their finger to slide the support base 28 along the surface of the flat flange portion 18C. Extending downward from the bottom surface 28B of the base 28 and through the slot 24 in the rail 18 is a locking latch 32. The locking latch 32 includes a neck portion 32A and a protruding tab 32B. The tab 32B includes a forward face 32C with a portion that slopes downward (away from the bottom of the base 28) and rearward (toward the back of the slide lock 26). The tab 32B also includes a top surface 32D extending forward from the neck 32A and is generally horizontal or slightly slopes away from the bottom surface 28B of the base 28. The top surface 32D of the tab 32B is spaced apart from the bottom surface 28B of the base 28 a sufficient distance to allow for the thickness of the flat flange portion 18C and the thickness of the flange of vertical post 14 as shown. The incorporation of a slope on the top surface 32D allows the slide lock 26 to accommodate flanges having different thicknesses in the rails (or other components) and posts. For example, common rail thicknesses include 11 gauge and 14 gauge. The use of a sloped top surface of the slide lock in the present embodiment can accommodate both size rails, as well as other gauges and thicknesses. The slope of the top surface 32D, with respect to the horizontal, is preferably in a range of between about 0 degrees to about 40 degrees, more preferably, between about 10 to about 25 degrees. In one preferred embodiment the slope is between about 15 degrees to about 20 degrees, or more preferably, about 17.7 degrees. As will be more apparent below, the sloped face 32C forces the slide lock 26 to slide rearward when the locking latch 32 is inserted into a hole 14H in the vertical post 14.

The slide lock 26 also includes a body 34 that extends downward from the bottom surface 28B of the base 28 and is spaced rearward and apart from the locking latch 32. The body 34 also extends through the slot 24. The body 34 includes a recess 34A within which a spring 36 is located. The spring 36 biases the slide lock 26 forward (toward the end of the rail.) In the illustrated embodiment, the spring 36 is a coil spring with a first leg 36A that extends into and contacts the rear of the slot 24. A second leg (not shown) on the opposite side of the coil 36 would contact a surface of the body 34. Thus, when the slide lock 26 is urged rearward (away from the vertical post 14), the coil spring 36 compresses (creating potential energy). When the slide lock 26 is released, the potential energy forces the slide lock 26 forward (toward the vertical post 14).

It should be readily apparent that other types of springs or mechanisms can be used for urging the slide lock forward toward the vertical post. For example, a portion of the body could be made from spring steel and be bent into spring lever (such as a leaf spring) which contacts the back of the slot directly.

As should be apparent from the above discussion, the spring 36 maintains the slide lock 26 at the forward end of the slot 24 in the rail 18. This corresponds to the initial or locked position. There are two different methods for attaching the rail 18 to the vertical post 14. In a first embodiment, the user slides the slide lock rearward by applying pressure to the release lever 30 (the unlocked position). The user then aligns the tab 32B with holes 14H in the vertical post (and if the rail includes projections 22, the projections 22 are also aligned with adjacent holes 14H). The user moves the bottom surface of the rail 18 toward the top surface of the vertical post, inserting the tab 32B through the hole 14H (and allowing the protections 22 to enter the adjacent holes 14H if applicable). Once the rail is lying on the top surface of the vertical post 14, the user releases the release lever 30 and the spring 36 urges the slide lock 26 toward the vertical post 14 causing the tab 32B to capture and lock the rail to the flange of the vertical post.

Alternatively, the user need not slide the slide lock 26 rearward. Instead, the user aligns the projections 22 and the tab 32B with holes 14H in the vertical post. The user moves the bottom surface of the rail 18 toward the top surface of the vertical post. As the tab 32B slides into the hole 14H, the sloped portion of the forward face 32C contacts the edge of the hole 14H and forces the slide lock 26 to slide rearward in the slot 24 until the top 32D passes through the hole 14H. At that point, the rail will be lying on the top surface of the vertical post 14 (with the optional projections 22 in the adjacent holes), the force of the spring 36 urges the slide lock 26 toward the vertical post 14 causing the tab 32B to capture and lock the rail to the flange of the vertical post.

To remove the rail 18 from the vertical post, the user simply slides the release lever 30 rearward causing the slide lock 26 to slide along the plane 18P into the unlocked position. This causes the tab 32B to slide rearward and out of engagement with the flange of the vertical post. The user then separates the rail from the vertical post.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed. The various embodiments and elements can be interchanged or combined in any suitable manner as necessary.

The use of directions, such as forward, rearward, top and bottom, upper and lower are with reference to the embodiments shown in the drawings and, thus, should not be taken as restrictive. Reversing or flipping the embodiments in the drawings would, of course, result in consistent reversal or flipping of the terminology.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalent.

What is claimed is:

1. An electronics rack component removably attachable to an electronics rack, the rack component including at least one slide locking mechanism for removably securing the component to the rack, the component including a flat flange portion located at one end of the component, the flat flange portion including a slot formed through the flat flange portion proximate to the end, the slide locking mechanism attached to the flat flange portion over the slot so that a portion of the slide mechanism extends through the slot, the slide lock mechanism comprising:
    a slide lock with a support base that has a top surface and a flat bottom surface, the bottom surface configured to slide along the flat flange portion of the rail, the base has a width that is wider than a width of the slot so that the base is supported by the flat flange portion;
    a release lever protrudes from the top surface of the support base and provides a structure or surface for a user's finger to slide the support base along the flat flange portion;
    a locking latch extends downward from the bottom surface of the base and through the slot in the rail, the locking latch includes a neck portion attached to the bottom surface of the base and a protruding tab attached to an opposite end of the neck portion, the tab includes a forward face with a portion that slopes away from the bottom of the base and toward a back of the slide lock, the tab includes a top surface extending forward from the neck and is generally horizontal or slopes away from the bottom surface of the base, the top surface of the tab is spaced apart from the bottom surface of the base a distance to accommodate the flat flange portion and a flange on the electronics rack;
    a body extends downward from the bottom surface of the base and is spaced rearward and apart from the locking latch, the body extends through the slot in the component; and
    a spring mounted to or formed on the body and engages with the component so as to bias the slide lock toward the end of the component.

2. The electronics rack component of claim 1, wherein the spring is a coil spring with a first leg that extends into and contacts a rear surface of the slot and a second leg on an opposite side of the coil contacts a surface of the body.

3. The electronics rack component of claim 1, wherein the spring is a lever formed on a portion of the housing which contacts the back of the slot.

4. The electronics rack component of claim 2, wherein the body includes a recess within which the spring is located.

5. The electronics rack component of claim 1, wherein the component is selected from a group consisting of a cross-rail, cross-bar, bracket, cable management cage, tray table, and shelf.

6. The electronics rack component of claim 1, wherein the slope of the top surface is in a range of between about 0 degrees to about 40 degrees.

7. The electronics rack component of claim 1, wherein the slope of the top surface is in a range of between about 10 to about 25 degrees.

8. An electronics rack component removably attachable to an electronics rack, the rack component selected from a group consisting of a cross-rail, cross-bar, bracket, cable management cage, tray table, and shelf, the rack component including at least one slide locking mechanism for removably securing the component to the rack, the component including a flat flange portion located at one end of the component, the flat flange portion including a slot formed through the flat flange portion proximate to the end, the slide locking mechanism attached to the flat flange portion over the slot so that a portion of the slide mechanism extends through the slot, the slide lock mechanism comprising:

a slide lock with a support base that has a top surface and a flat bottom surface, the bottom surface configured to slide along the flat flange portion of the rail, the base has a width that is wider than a width of the slot so that the base is supported by the flat flange portion;

a release lever protrudes from the top surface of the support base and provides a structure or surface for a user's finger to slide the support base along the flat flange portion;

a locking latch extends downward from the bottom surface of the base and through the slot in the rail, the locking latch includes a neck portion attached to the bottom surface of the base and a protruding tab attached to an opposite end of the neck portion, the tab includes a forward face with a portion that slopes away from the bottom of the base and toward a back of the slide lock, the tab includes a top surface extending forward from the neck and sloping away from the bottom surface of the base at an angle in a range of between about 10 to about 25 degrees, the top surface of the tab is spaced apart from the bottom surface of the base a distance to accommodate the flat flange portion and a flange on the electronics rack;

a body extends downward from the bottom surface of the base and is spaced rearward and apart from the locking latch, the body extends through the slot in the component; and a spring mounted to or formed on the body and engages with the component so as to bias the slide lock toward the end of the component, wherein the spring is a coil spring with a first leg that extends into and contacts a rear surface of the slot and a second leg on an opposite side of the coil contacts a surface of the body.

9. An electronics rack having a base, a top and at least four vertical posts, each post being attached to the base at one end and the top at another end; and an electronics rack component according to claim 1 removably attached to at least one post.

* * * * *